United States Patent
Lin et al.

(10) Patent No.: US 7,180,001 B1
(45) Date of Patent: Feb. 20, 2007

(54) FOLDABLE SIGNAL TRANSMISSION CABLE ASSEMBLY

(75) Inventors: Gwun-Jin Lin, Taoyuan (TW); Chih-Heng Chuo, Taoyuan (TW); Kuo-Fu Su, Taoyuan (TW)

(73) Assignee: Advanced Flexible Circuits Co., Ltd., Taoyuan (TW)

( * ) Notice: Subject to any disclaimer, the term of this patent is extended or adjusted under 35 U.S.C. 154(b) by 0 days.

(21) Appl. No.: 11/283,958

(22) Filed: Nov. 22, 2005

(30) Foreign Application Priority Data

Sep. 30, 2005 (TW) .............................. 94134384 A

(51) Int. Cl.
*H01B 7/08* (2006.01)
(52) U.S. Cl. .................................. 174/117 F
(58) Field of Classification Search ............ 174/117 F, 174/117 FF
See application file for complete search history.

(56) References Cited

U.S. PATENT DOCUMENTS

| | | | | |
|---|---|---|---|---|
| 4,406,915 A | * | 9/1983 | Lang ...................... | 174/117 F |
| 4,817,281 A | * | 4/1989 | Sugawara ................... | 29/857 |
| 5,408,050 A | * | 4/1995 | Kashio et al. .......... | 174/117 F |

* cited by examiner

*Primary Examiner*—Chau N. Nguyen
(74) *Attorney, Agent, or Firm*—Rosenberg, Klein & Lee

(57) ABSTRACT

A foldable signal transmission cable assembly includes parallelly extended first and second cables, which are connected at opposite first and second ends by transverse first and second connecting sections, respectively, and have first and second connectors provided at the first end of the first cable and at the second end of the first or the second cable, respectively, to electrically connect to signal lines provided on the first and second cables and the first and second connecting sections. The first and second connecting sections may be bent along folding lines provided at middle points thereof, so as to turn and locate the second cable below the first cable. The first and second cables may be formed from a single-side, a double-side, a multisided, or a multilayer substrate, and may include a cluster section.

16 Claims, 11 Drawing Sheets

FOLDABLE SIGNAL TRANSMISSION CABLE ASSEMBLY

FIELD OF THE INVENTION

The present invention relates to a signal transmission cable, and more particularly to a foldable signal transmission cable assembly.

BACKGROUND OF THE INVENTION

A conventional signal transmission cable includes a plurality of parallelly arranged insulated conductors, and is used in various kinds of electrical appliances, electronic apparatus, computers, and communication apparatus to transmit signals.

In recent years, the soft circuit substrate technique has been widely employed in making signal transmission cables. Most currently available signal transmission cables employing the soft circuit substrate technique include a single-side, a double-side, a multisided, or a multilayer substrate according to the number of required transmission lines. That is, signal transmission cables using a double-side or a multilayer substrate may have increased number of transmission lines in the same one cable product. Moreover, the signal transmission cables employing the soft circuit substrate technique may have changeable pin arrangement through jumping connection.

The conventional signal transmission cables are only suitable for extending through a narrow flat space. However, pivoting mechanisms with round holes are often employed in many currently available electronic apparatus and communication apparatus. For example, the currently widely accepted mobile phones usually include a cover or a screen connected to a main unit of the mobile phone via a pivoting mechanism. At present, a miniaturized cable or a cluster of very fine conductors is used as a signal transmission cable to transmit electric signals from the main unit to the cover or the screen of the mobile phone.

When the signal transmission cable has a flat configuration, it can be easily extended through a narrow flat space without problems. However, it is also very important the cable can endure constant bending and/or can be bent frequently. The bending endurance is a common standard in determining the quality of a signal transmission cable. For a signal transmission cable having a single-side substrate, since all the conductors of the cable are arranged on only one surface of the soft circuit substrate, the cable generally presents relatively good bending endurance. However, for the signal transmission cable having a double-side, a multisided, or a multilayer substrate, conductors are differently arranged on two or more surfaces of the substrate and tend to be pulled and become useless after the cable has been bent many times. On the other hand, while the cable with a single-side substrate has better bending endurance, it includes fewer transmission lines and fails to meet actual need.

SUMMARY OF THE INVENTION

It is therefore a primary object of the present invention to provide a foldable signal transmission cable assembly that has good bending quality and provides an increased number of transmission lines at the same time.

Another object of the present invention is to provide a foldable signal transmission cable assembly, to which plug connectors may be connected in different manners, in order to meet different pin requirements and provide different plug connector positions for the cable assembly to be more flexible in use.

A further object of the present invention is to provide a foldable signal transmission cable assembly that may combine double-side, multisided, and multilayer substrates to provide different circuit layouts and achieve the purpose of adaptive pin arrangement, enabling the cable assembly to be used in different electrical connecting conditions.

The foldable signal transmission cable assembly of the present invention may be easily and differently folded and combined for using on electronic products requiring different pin arrangements and different plug connector positions. The foldable signal transmission cable assembly of the present invention also presents good bending quality and high bending endurance while provides increased number of transmission lines. Moreover, the foldable signal transmission cable assembly of the present invention combines the double-side, multisided, and multilayer substrate designs, and therefore has more flexibly adjustable pin arrangement and jumping connection. Furthermore, Since the cable assembly of the present invention may include one or more cluster sections, it is very suitable for extending through round holes on a pivoting mechanism.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
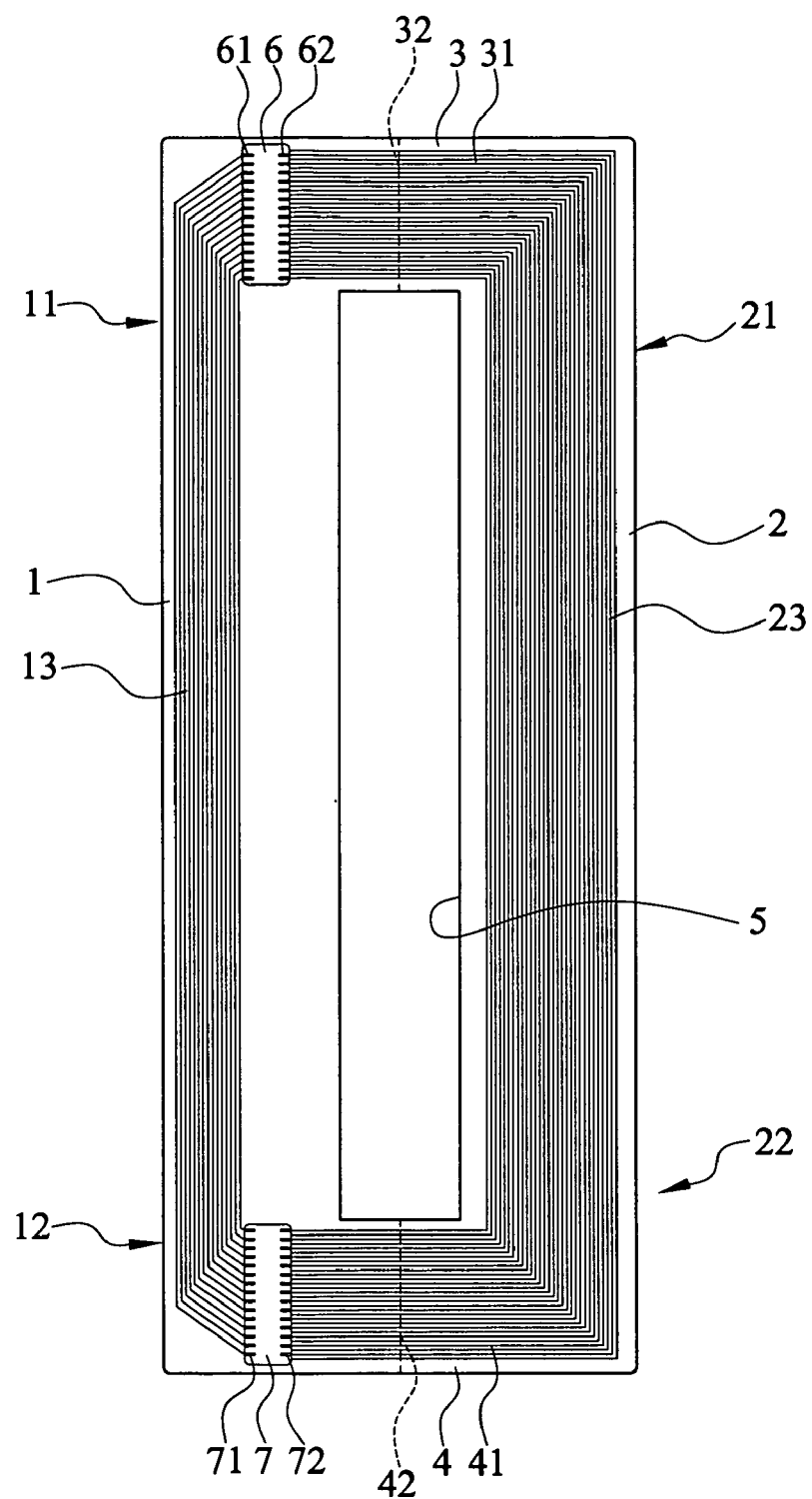
FIG. 1 is a developed plan view of a foldable signal transmission cable assembly according to a first embodiment of the present invention.
Figure 2:
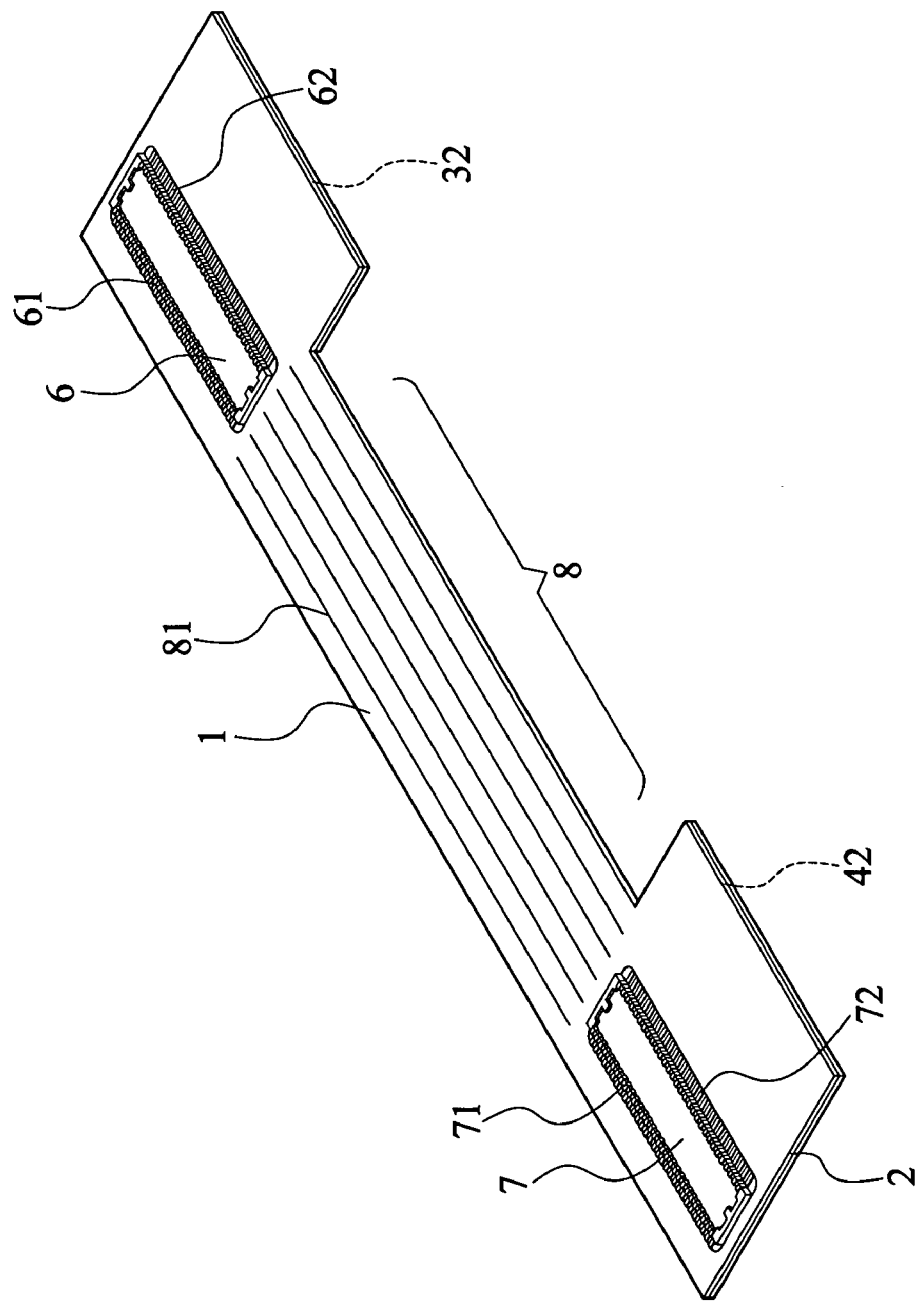
FIG. 2 is a perspective view of the foldable signal transmission cable assembly of FIG. 1 in a folded state.

Please refer to FIG. 1 that is a developed plan view of a foldable signal transmission cable assembly according to a first embodiment of the present invention, and to FIG. 2 that is a perspective view of the foldable signal transmission cable assembly of FIG. 1 in a folded state. As shown, the foldable signal transmission cable assembly according to the first embodiment of the present invention includes two parallelly extended cables, namely, a first cable 1 and a second cable 2.

The first cable 1 has a first end 11 and a second end 12, and includes a plurality of signal lines 13 extended between the first and the second end 11, 12. Similarly, the second cable 2 has a first end 21 and a second end 22, and includes a plurality of signal lines 23 extended between the first and the second end 21, 22. In the present invention, the first and the second cable 1, 2 are made using the soft circuit substrate technique.

A section of the foldable signal transmission cable assembly located between the first end 11 of the first cable 1 and the first end 21 of the second cable 2 is a first connecting section 3, in which a plurality of signal lines 31 are included. A folding line 32 is formed at a middle point of the first connecting section 3.

A section of the foldable signal transmission cable assembly located between the second end 12 of the first cable 1 and the second end 22 of the second cable 2 is a second connecting section 4, in which a plurality of signal lines 41 are included. A folding line 42 is formed at a middle point of the second connecting section 4. The first cable 1, the second cable 2, the first connecting section 3, and the second connecting section 4 together enclose an open area 5 in them. By bending the foldable signal transmission cable assembly of the present invention along the folding lines 32, 42, the second cable 2 is turned to locate below the first cable 1.

The first cable 1 is provided at the first end 11 with a first connector 6, on which a first group of contacts 61 and a second group of contacts 62 are provided. The first group of contacts 61 is electrically connected to the signal lines 13 at the first end 11 of the first cable 1, and the second group of contacts 62 is electrically connected to the signal lines 23 at the first end 21 of the second cable 2 via the signal lines 31 in the first connecting section 3.

The first cable 1 is provided at the second end 12 with a second connector 7, on which a first group of contacts 71 and a second group of contacts 72 are provided. The first group of contacts 71 is electrically connected to the signal lines 13 at the second end 12 of the first cable 1, and the second group of contacts 72 is electrically connected to the signal lines 23 at the second end 22 of the second cable 2 via the signal lines 41 in the second connecting section 4.

The first and the second cable 1, 2 may be separately formed from a single-side substrate. That is, both of the first and the second cable 1, 2 are provided on only one surface thereof with a plurality of parallelly extended signal lines. Alternatively, the first and the second cable 1, 2 may be separately formed from a double-side substrate. That is, both of the first and the second cable 1, 2 are provided on two opposite surfaces thereof with a plurality of parallelly extended signal lines. The signal lines provided on two opposite surfaces of the cables 1, 2 may be electrically connected to one another via through holes formed on the substrate using a conventional skill.

The first and the second cable 1, 2 may also be separately formed from a multilayer substrate. The multilayer substrates for the first and the second cable 1, 2 may be produced using conventional multilayer circuit substrate manufacturing techniques. Every layer of the multilayer substrate is independently provided with a plurality of signal lines. The signal lines provided on different layers of the multilayer substrate may be electrically connected to one another by way of jumper connection via through holes formed on the substrate using a conventional skill. Alternatively, the first and the second cable 1, 2 may be separately formed from a multisided substrate, which may be produced using conventional multisided circuit substrate manufacturing techniques. Again, every side of the multisided substrate is independently provided with a plurality of signal lines.

The first and the second cable 1, 2 may be in the form of a flat cable, so that they are suitable for extending through a narrow flat space and transmitting signals between a mainframe and a screen of the portable computer and/or the mobile phone. When the second cable 2 has been turned to locate below the first cable 1, the first end 11 and the second end 12 of the first cable 1 are attached to the first end 21 and the second end 22 of the second cable 2, respectively, while a section of the first cable 1 between the first and the second end 11, 12 is separated from a section of the second cable 2 between the first and the second end 21, 22. With these arrangements, the foldable signal transmission cable assembly of the present invention could have improved bending endurance.

Figure 3:
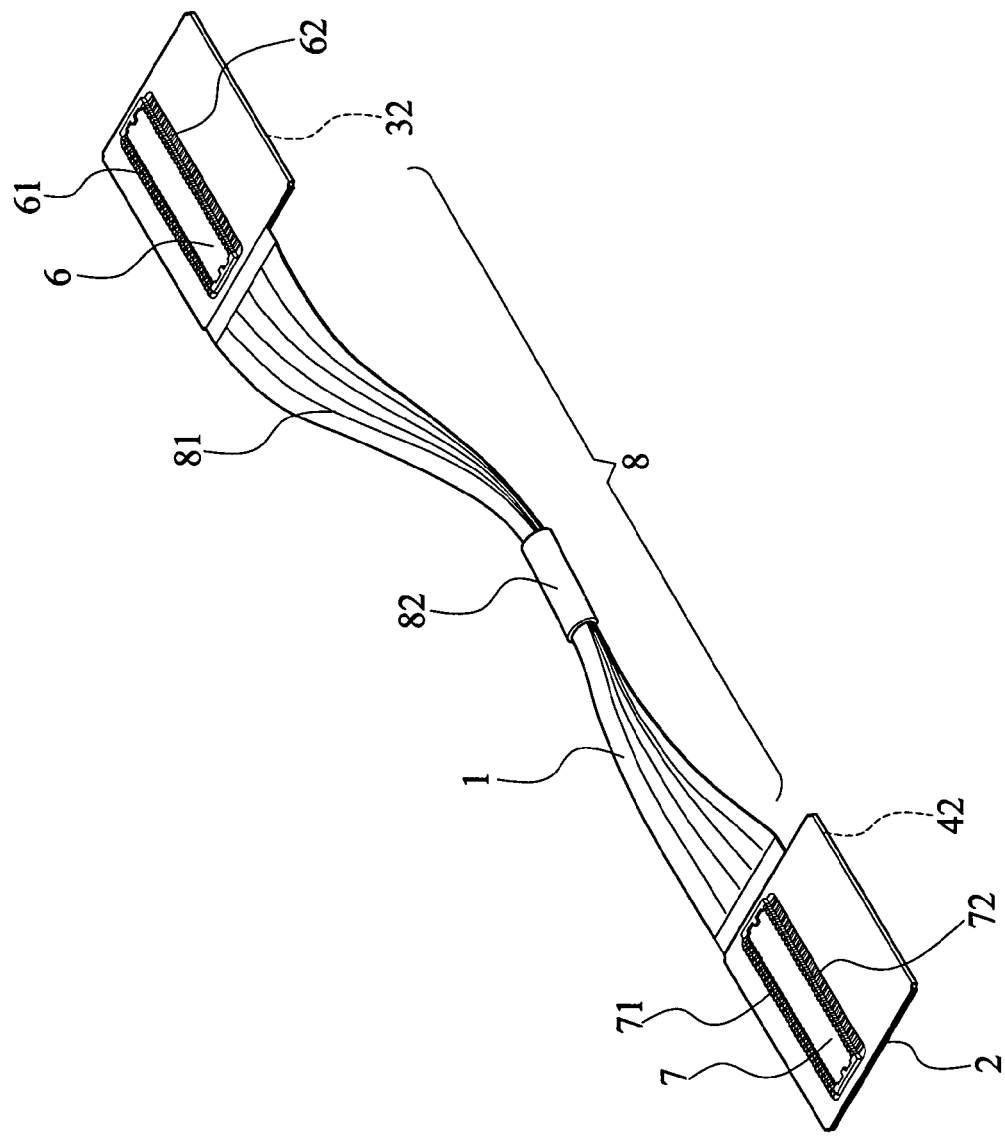
FIG. 3 shows the foldable signal transmission cable assembly of FIG. 2 including a cluster section.

Please refer to FIG. 3. The first cable 1 and/or the second cable 2 may be provided near a middle portion with a cluster section 8, which is formed by cutting the first cable 1 and/or the second cable 2 along a plurality of paralleled cutting lines 81 extended in the lengthwise direction of the cables 1 and 2, so that every signal line of the first and/or the second cable 1, 2 is separated from the others and independently freely bendable. With the cluster section 8, the first and/or the second cable 1, 2 is suitable for use on an electronic product having pivoting mechanism with round holes. The cluster section 8 may be protectively bound with a protective binding material 82, and may have a single-side or a double-side substrate.

Figure 4:
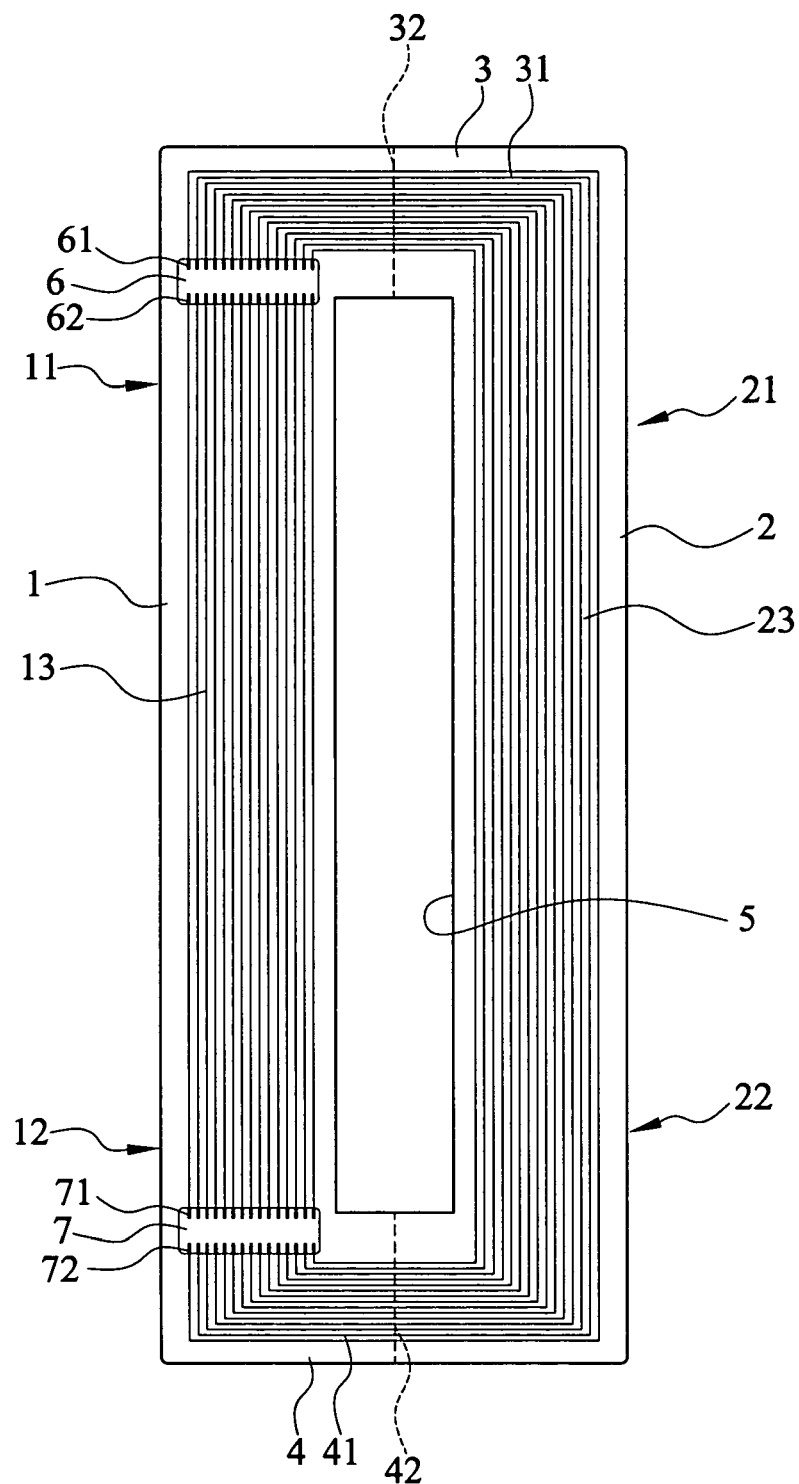
FIG. 4 is a developed plan view of a variant of the foldable signal transmission cable assembly according to the first embodiment of the present invention.
Figure 5:
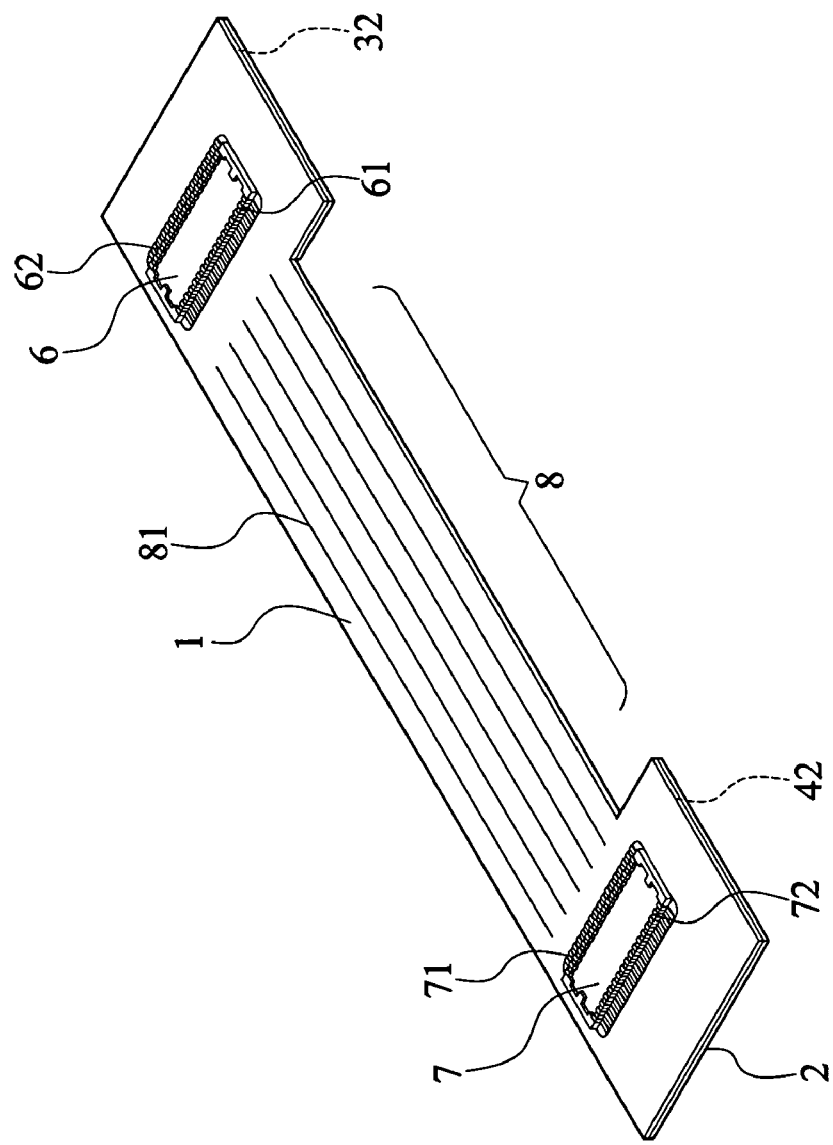
FIG. 5 is a perspective view of the foldable signal transmission cable assembly of FIG. 4 in a folded state.

The first connector 6 and the second connector 7 may be in the form of a socket connector, and may be arranged on the first cable 1 to extend in the longitudinal direction of the first cable 1, as shown in FIGS. 1 to 3. However, in a variant of the signal transmission cable assembly according to the first embodiment of the present invention, the first and the second connector 6, 7 may be otherwise arranged on the first cable 1 to extend in the transverse direction of the first cable, as shown in FIGS. 4 and 5, which are developed plan view and folded perspective view, respectively.

Figure 6:
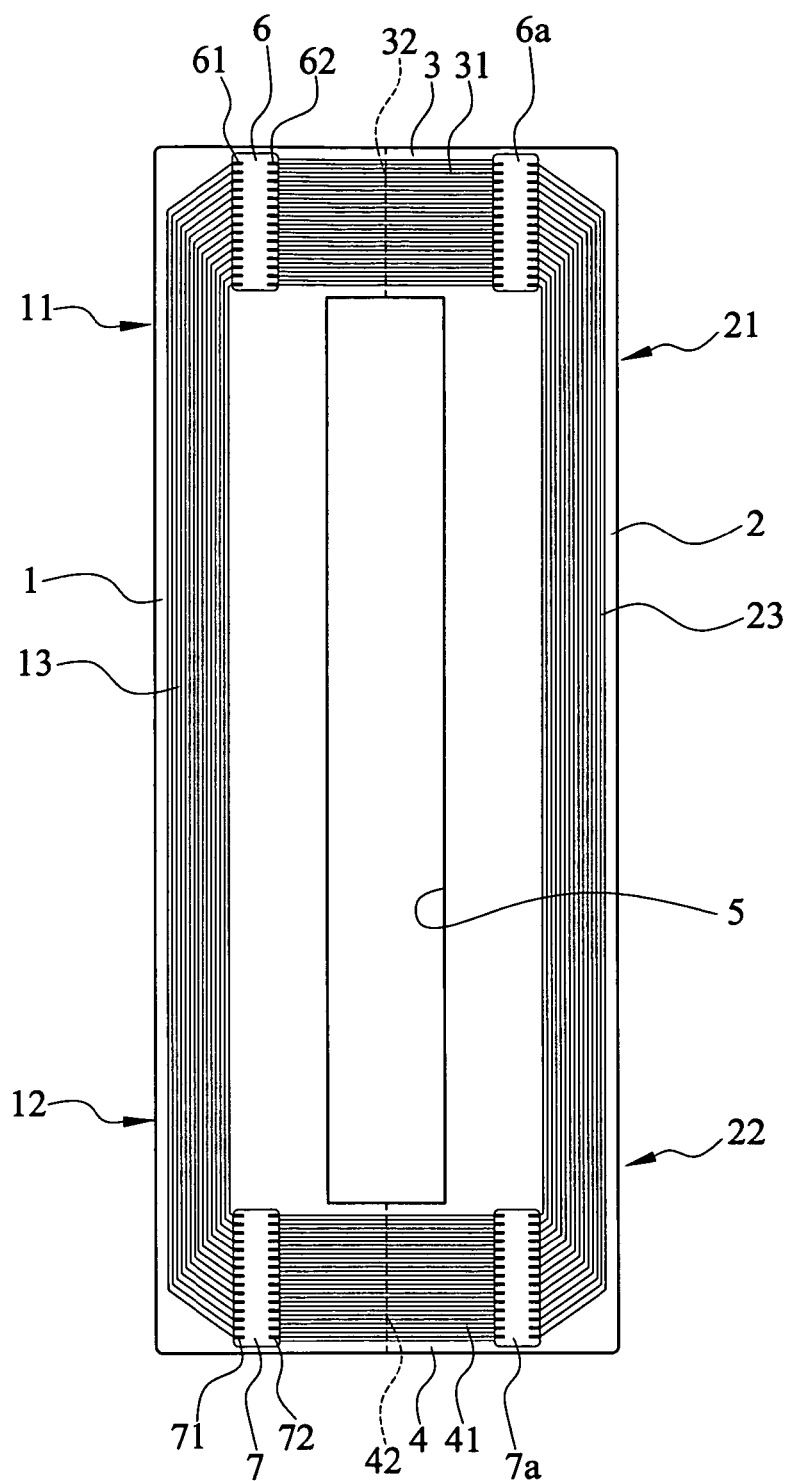
FIG. 6 is a developed plan view of a foldable signal transmission cable assembly according to a second embodiment of the present invention.
Figure 7:
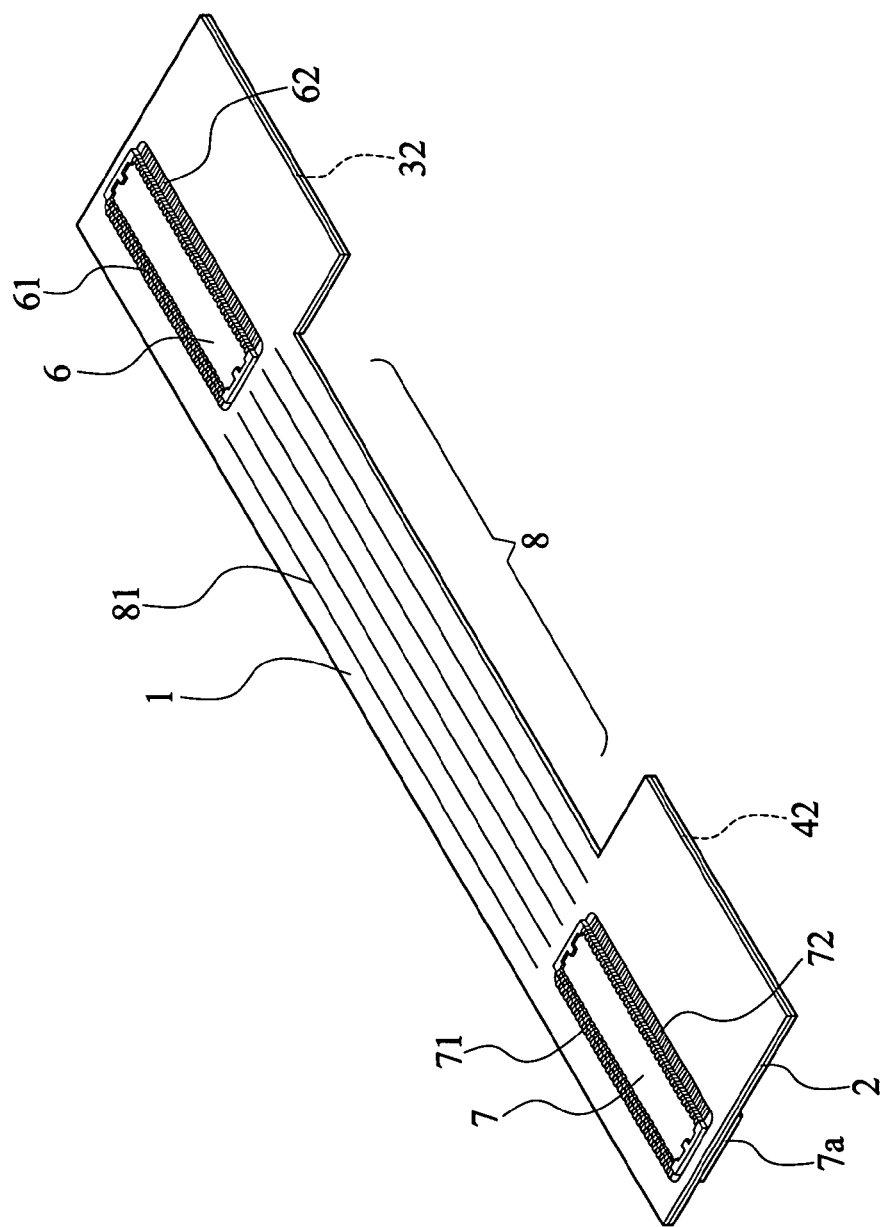
FIG. 7 is a perspective view of the foldable signal transmission cable assembly of FIG. 6 in a folded state.

FIGS. 6 and 7 are developed plan view and folded perspective view, respectively, of a foldable signal transmission cable assembly according to a second embodiment of the present invention. The foldable signal transmission cable assembly in the second embodiment is generally structurally similar to that in the first embodiment, except that it further includes a third connector 6a provided at the first end 21 of the second cable 2, and a fourth connector 7a provided at the second end 22 of the second cable 2. Whereby, when the foldable signal transmission cable assembly in the second embodiment is bent along the folding lines 32, 42 to turn and locate the second cable 2 below the first cable 1, there is a connector provided at every end of upper and lower surfaces of the folded signal transmission cable assembly to meet different requirements in the application of the cable assembly.

Figure 8:
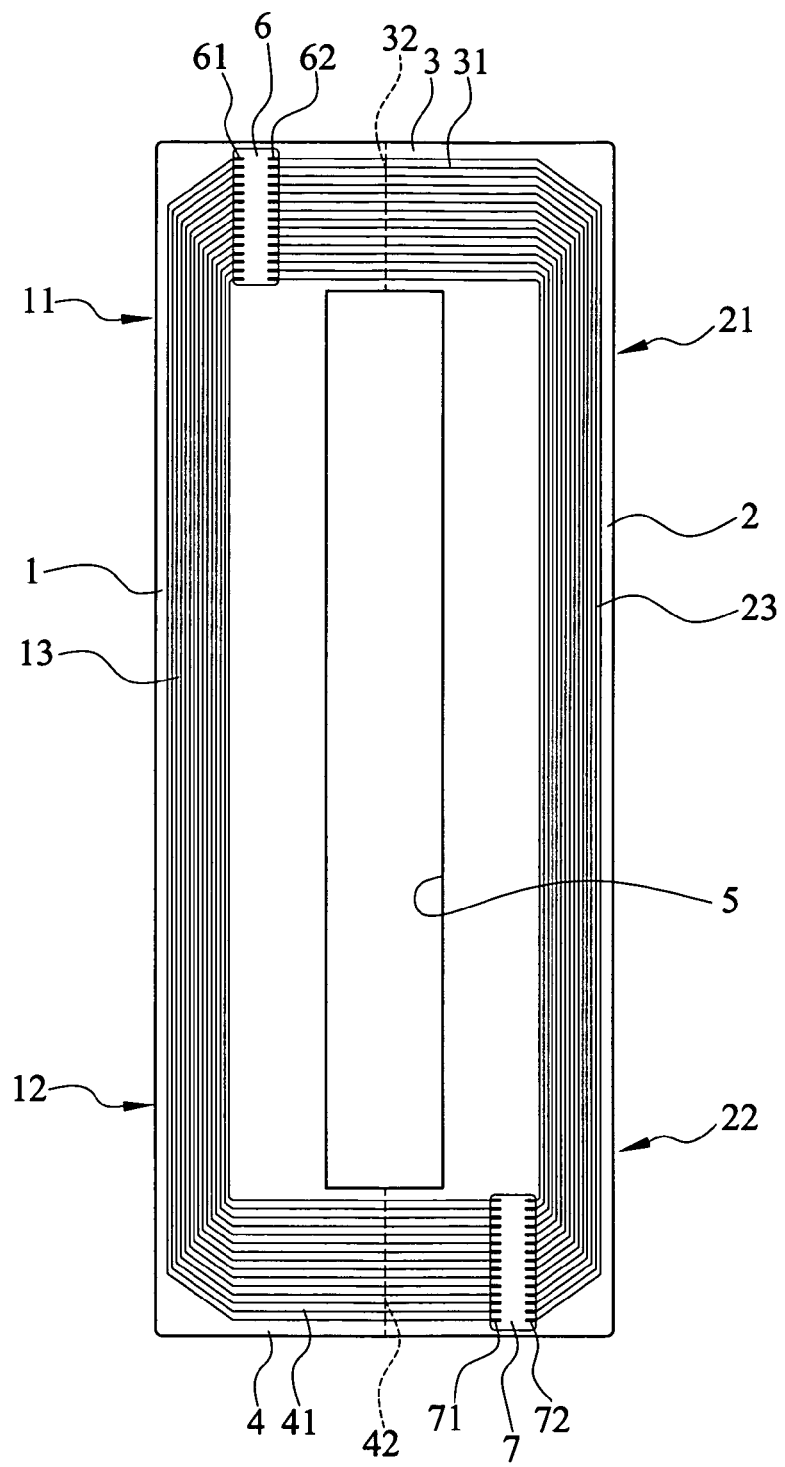
FIG. 8 is a developed plan view of a foldable signal transmission cable assembly according to a third embodiment of the present invention.
Figure 9:
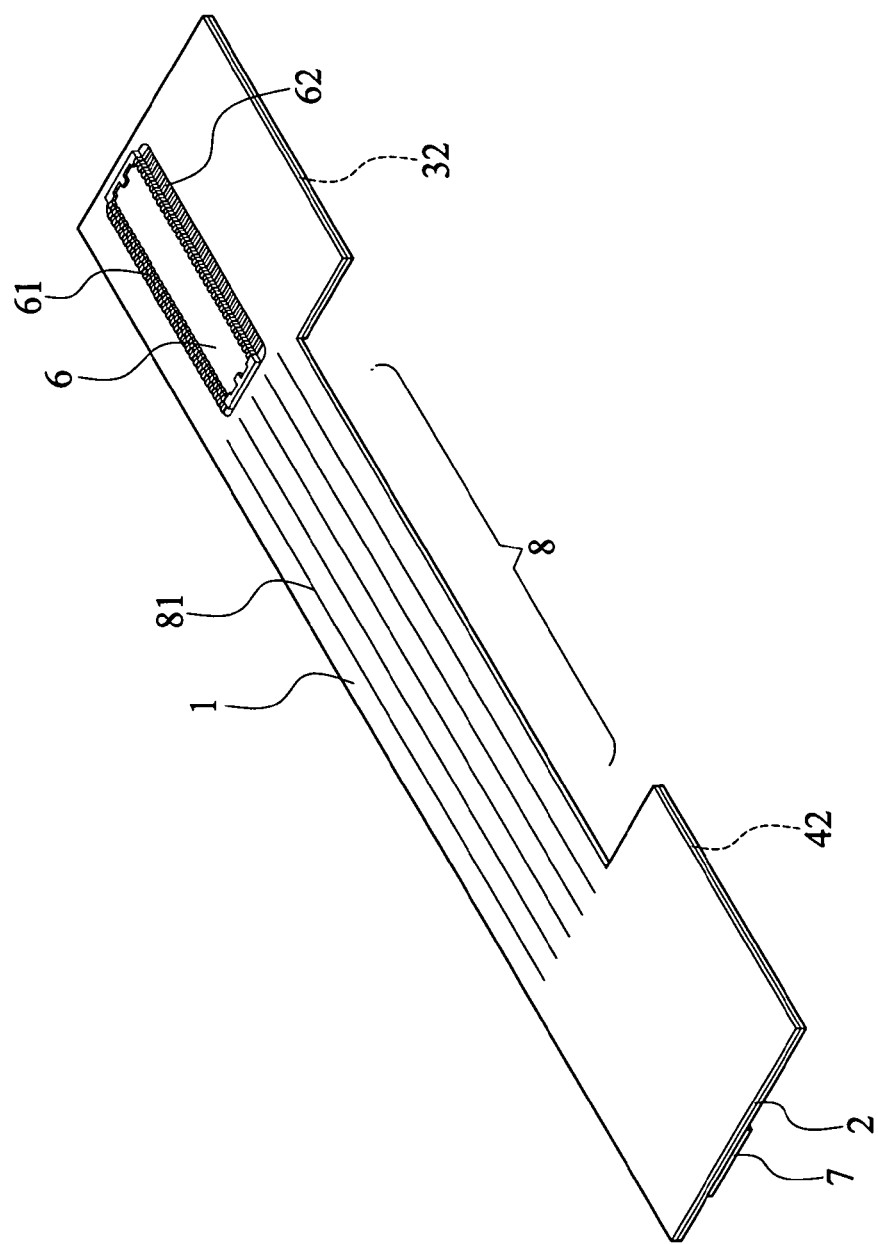
FIG. 9 is a perspective view of the foldable signal transmission cable assembly of FIG. 8 in a folded state.

FIGS. 8 and 9 are developed plan view and folded perspective view, respectively, of a foldable signal transmission cable assembly according to a third embodiment of the present invention. The foldable signal transmission cable assembly in the third embodiment is generally structurally similar to that in the first embodiment, except that it includes a first connector 6 provided at the first end 11 of the first cable 1, and a second connector 7 provided at the second end 22 of the second cable 2.

In the third embodiment, the first connector 6 provided at the first end 11 of the first cable 1 also includes a first group of contacts 61 electrically connected to the signal lines 13 at the first end 11 of the first cable, and a second group of contacts 62 electrically connected to the signal lines 23 at the first end 21 of the second cable 2 via the first connecting section 3. Similarly, the second connector 7 provided at the second end 22 of the second cable 2 also includes a first group of contacts 71 electrically connected to the signal lines 13 at the second end 12 of the first cable via the second connecting section 4, and a second group of contacts 72 electrically connected to the signal lines 23 at the second end 22 of the second cable 2. Whereby, when the foldable signal transmission cable assembly in the third embodiment is bent along the folding lines 32, 42 to turn and locate the second cable 2 below the first cable 1, there are a connector, i.e. the first connector 6, provided at an end of an upper surface of the folded signal transmission cable assembly, and another connector, i.e. the second connector 7, provided on a lower surface of the folded signal transmission cable assembly at an end opposite to the first connector 6.

Figure 10:
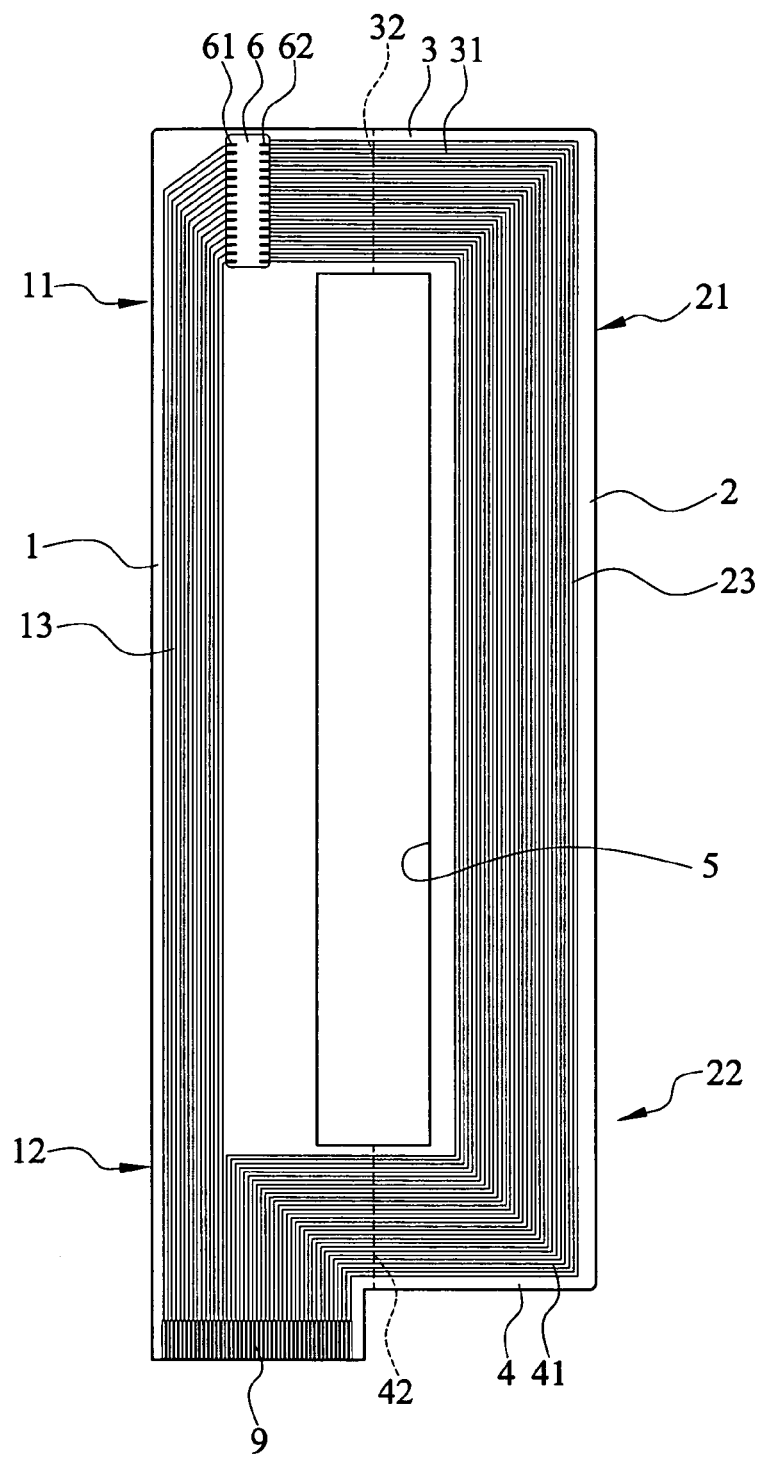
FIG. 10 is a developed plan view of a foldable signal transmission cable assembly according to a fourth embodiment of the present invention.

While the connectors 6, 6a, 7, and 7a illustrated in the above first to third embodiment of the present invention are in the form of a socket connector, it is understood other connecting forms may also be employed in the present invention to meet different requirements for signal transmission. For example, in a foldable signal transmission cable assembly according to a fourth embodiment of the present invention, a developed plan view of which is shown in FIG. 10, a first connector 6 is provided at the first end 11 of the first cable 1, and a plug terminal 9 is provided at the second 12 of the first cable 1 for plugging or connecting the cable assembly to other corresponding socket. The plug terminal 9 may be a golden finger plug terminal having a plurality of pins or a plug terminal with a sculpture contact section.

Figure 11:
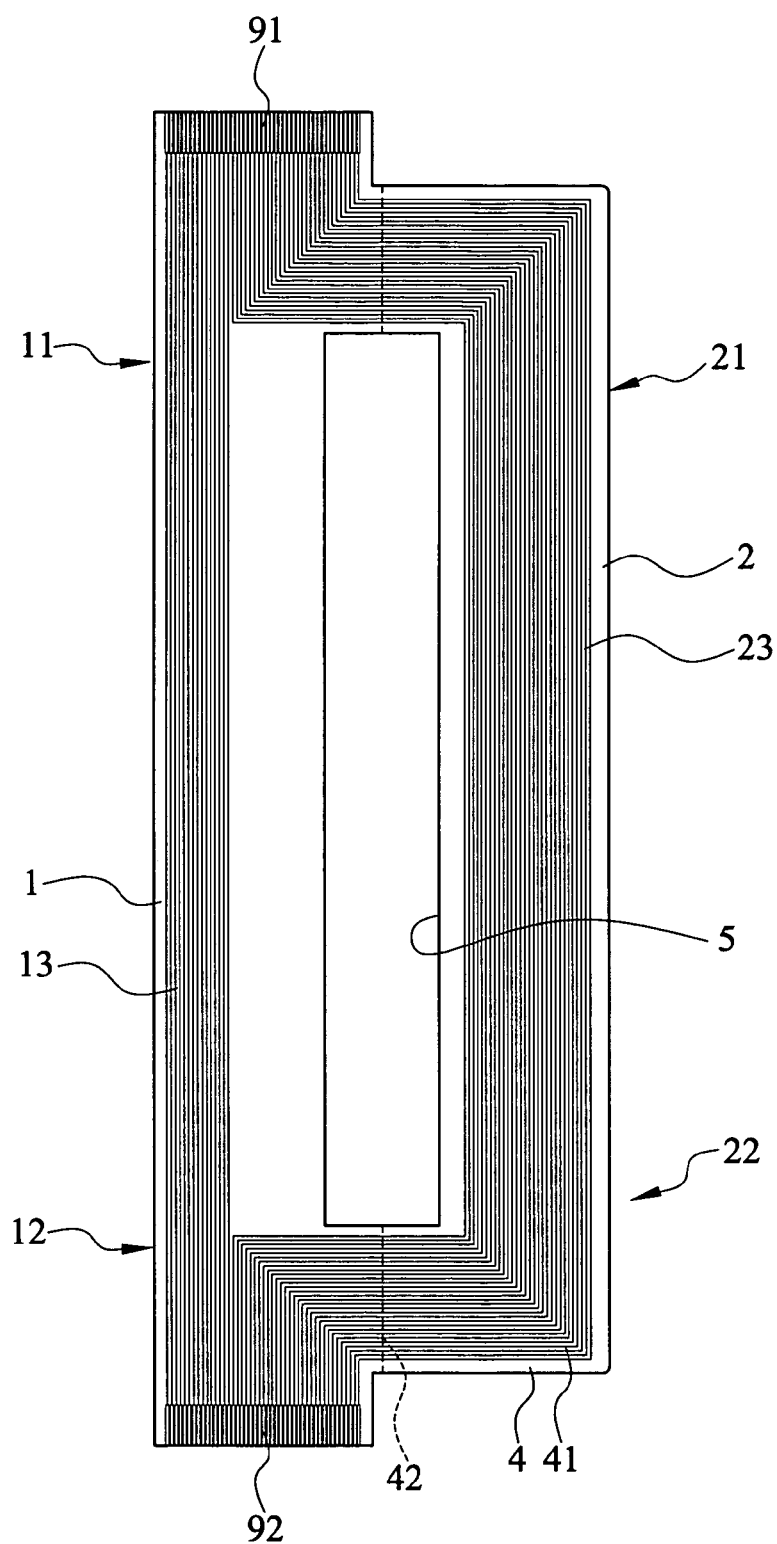
FIG. 11 is a developed plan view of a foldable signal transmission cable assembly according to a fifth embodiment of the present invention.

FIG. 11 is a developed plan view of a foldable signal transmission cable assembly according to a fifth embodiment of the present invention. In this fifth embodiment, none of the first and the second cable 1, 2 is provided with any socket connector. Instead, two plug terminals 91, 92 are separately provided at the first and the second end 11, 12 of the first cable 1 for connecting two ends of the folded cable assembly to other corresponding sockets.

With the above arrangements, the foldable signal transmission cable assembly of the present invention is highly flexible in use to satisfy different requirements in circuit connection.

What is claimed is:

1. A foldable signal transmission cable assembly, comprising:
    a first cable having a first and a second end, and including a plurality of signal lines arranged between said first and said second end;
    a second cable having a first and a second end, and including a plurality of signal lines arranged between said first and said second end;
    a first connecting section located between said first end of said first cable and said first end of said second cable;
    a second connecting section located between said second end of said first cable and said second end of said second cable having;
    a first connector provided at said first end on top of said first cable, and including a first group of contacts and a second group of contacts; said first group of contacts being electrically connected to said signal lines of said first cable at said first end of said first cable, and said second group of contacts being electrically connected to said signal lines of said second cable at said first end of said second cable via said first connecting section; and
    a second connector provided at said second end on top of said first cable, and including a first group of contacts and a second group of contacts; said first group of contacts of said second connector being electrically connected to said signal lines of said first cable at said second end of said first cable, and said second group of contacts of said second connector being electrically connected to said signal lines of said second cable at said second end of said second cable via said second connecting section; and
    said first and said second connecting section being provided at a respective middle point having a folding line, along which said first and second connecting section are bent to turn and locate said second cable below said first cable such that said first cable is contiguous said second cable in overlying relation.

2. The foldable signal transmission cable assembly as claimed in claim 1, wherein said first and said second cable are of a structure selected from the group consisting of single-side substrate, double-side substrate, multilayer substrate, and multisided substrate.

3. The foldable signal transmission cable assembly as claimed in claim 1, wherein one of said first and said second cable includes a cluster section, said cluster section being formed by cutting said first or said second cable along a plurality of paralleled cutting lines extended in the lengthwise direction of said first or said second cable, so that every signal line of said first or said second cable is separated from the others and independently freely bendable.

4. The foldable signal transmission cable assembly as claimed in claim 3, wherein said cluster section is of a structure selected from the group consisting of single-side substrate and double-side substrate.

5. The foldable signal transmission cable assembly as claimed in claim 1, wherein said first cable, said second cable, said first connecting section, and said second connecting section together enclose an open area.

6. The foldable signal transmission cable assembly as claimed in claim 1, wherein one of said first and said second connector is a socket connector.

7. The foldable signal transmission cable assembly as claimed in claim 1, wherein one of said first and said second connector is a plug terminal.

8. The foldable signal transmission cable assembly as claimed in claim 1, further comprising a third connector provided at said first end of said second cable.

9. The foldable signal transmission cable assembly as claimed in claim 8, further comprising a fourth connector provided at said second end of said second cable.

10. A foldable signal transmission cable assembly, comprising:
    a first cable having a first and a second end, and including a plurality of signal lines arranged between said first and said second end;
    a second cable having a first and a second end, and including a plurality of signal lines arranged between said first and said second end;
    a first connecting section located between said first end of said first cable and said first end of said second cable;

a second connecting section located between said second end of said first cable and said second end of said second cable;

a first connector provided at said first end on top of said first cable, and including a first group of contacts and a second group of contacts; said first group of contacts being electrically connected to said signal lines of said first cable at said first end of said first cable, and said second group of contacts being electrically connected to said signal lines of said second cable at said first end of said second cable via said first connecting section; and a second connector provided at said second end on top of said second cable, and including a first group of contacts and a second group of contacts; said first group of contacts of said second connector being electrically connected to said signal lines of said first cable at said second end of said first cable via said second connecting section, and said second group of contacts of said second connector being electrically connected to said signal lines of said second cable at said second end of said second cable; and said first and said second connecting section being provided at respective middle point having a folding line, along which said first and second connecting section are bent to turn and locate said second cable below said first cable such that said first cable is contiguous said second cable in overlying relation.

11. The foldable signal transmission cable assembly as claimed in claim 10, wherein said first and said second cable are of a structure selected from the group consisting of single-side substrate, double-side substrate, multilayer substrate, and multisided substrate.

12. The foldable signal transmission cable assembly as claimed in claim 10, wherein one of said first and said second cable includes a cluster section, said cluster section being formed by cutting said first or said second cable along a plurality of paralleled cutting lines extended in the lengthwise direction of said first or said second cable, so that every signal line of said first or said second cable is separated from the others and independently freely bendable.

13. The foldable signal transmission cable assembly as claimed in claim 12, wherein said cluster section is of a structure selected from the group consisting of single-side substrate and double-side substrate.

14. The foldable signal transmission cable assembly as claimed in claim 10, wherein said first cable, said second cable, said first connecting section, and said second connecting section together enclose an open area.

15. The foldable signal transmission cable assembly as claimed in claim 10, wherein one of said first and said second connector is a socket connector.

16. The foldable signal transmission cable assembly as claimed in claim 10, wherein one of said first and said second connector is a plug terminal.

* * * * *